(12) United States Patent
Chae et al.

(10) Patent No.: US 11,381,231 B2
(45) Date of Patent: *Jul. 5, 2022

(54) DIGITAL MEASUREMENT CIRCUIT AND MEMORY SYSTEM USING THE SAME

(71) Applicant: Samsung Electronics Co., Ltd., Suwon-si (KR)

(72) Inventors: Kwan Yeob Chae, Seoul (KR); Jong-Ryun Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/989,074

(22) Filed: Aug. 10, 2020

(65) Prior Publication Data

US 2020/0373919 A1 Nov. 26, 2020

Related U.S. Application Data

(63) Continuation of application No. 16/036,030, filed on Jul. 16, 2018, now Pat. No. 10,840,896.

(30) Foreign Application Priority Data

Dec. 21, 2017 (KR) .................. 10-2017-0176956

(51) Int. Cl.
*H03K 5/156* (2006.01)
*H03K 5/133* (2014.01)
(Continued)

(52) U.S. Cl.
CPC ..... *H03K 5/1565* (2013.01); *G01R 31/31721* (2013.01); *G01R 31/31725* (2013.01);
(Continued)

(58) Field of Classification Search
None
See application file for complete search history.

(56) References Cited

U.S. PATENT DOCUMENTS 6,178,109 B1 * 1/2001 Song .................. G11C 7/1078
365/149
6,313,622 B1 11/2001 Seki et al.
(Continued)

OTHER PUBLICATIONS

Jeong, Chan-Hui et al., "All-Digital Duty-Cycle Corrector With a Wide Duty Correction Range for DRAM Applications", IEEE Transactions on Very large Scale Integration (VLSI) Systems, vol. 24, No. 1, pp. 363-367, Jan. 2016.

*Primary Examiner* — Thomas J. Hiltunen
(74) *Attorney, Agent, or Firm* — Harness, Dickey & Pierce, P.L.C.

(57) ABSTRACT

A digital measurement circuit includes a first input flip-flop which receives a first signal through a data input terminal, receives a first clock signal through a clock input terminal, and outputs a second signal; a second input flip-flop which receives the second signal through a data input terminal, receives a second clock signal, which is an inverted signal of the first clock signal, through a clock input terminal, and outputs a third signal; and a delay line which receives the second signal and outputs first through n-th output signals, wherein n is an integer greater than one, and the first through n-th output signals are sampled based on the third signal to output first through n-th sampling signals is provided.

19 Claims, 17 Drawing Sheets

(51) Int. Cl.
*G01R 31/317* (2006.01)
*H03K 5/135* (2006.01)

(52) U.S. Cl.
CPC ....... *G01R 31/31727* (2013.01); *H03K 5/133* (2013.01); *H03K 5/135* (2013.01)

(56) References Cited

U.S. PATENT DOCUMENTS

| | | | |
|---|---|---|---|
| 6,819,157 B2 | 11/2004 | Cao et al. | |
| 7,225,092 B2 * | 5/2007 | Boerstler | G06F 1/06 702/79 |
| 7,365,548 B2 | 4/2008 | Neuman | |
| 7,403,055 B2 | 7/2008 | Minzoni | |
| 7,479,777 B2 | 1/2009 | Kelkar et al. | |
| 7,501,870 B2 | 3/2009 | Choi et al. | |
| 7,705,647 B2 * | 4/2010 | Dai | H03K 5/1565 327/175 |
| 7,777,543 B2 * | 8/2010 | Park | H03K 5/1565 327/175 |
| 7,961,559 B2 | 6/2011 | Dixon et al. | |
| 7,994,830 B2 * | 8/2011 | Kaneko | H03L 7/08 327/157 |
| 8,032,850 B2 * | 10/2011 | Boerstler | G06F 30/327 716/113 |
| 8,502,583 B2 | 8/2013 | Kim et al. | |
| 8,542,045 B2 * | 9/2013 | Na | H03K 5/1565 327/175 |
| 8,736,329 B1 * | 5/2014 | Rajavi | H03K 5/1565 327/172 |
| 8,736,338 B2 | 5/2014 | Cao et al. | |
| 9,063,519 B2 | 6/2015 | Chien | |
| 9,312,839 B2 | 4/2016 | Inagawa | |
| 9,374,105 B2 * | 6/2016 | Eddleman | H03K 9/08 |
| 9,501,041 B2 | 11/2016 | Shim et al. | |
| 9,678,154 B2 | 6/2017 | Datta et al. | |
| 9,755,529 B2 * | 9/2017 | Chen | H02M 1/08 |
| 10,343,077 B2 * | 7/2019 | Pascale | A63H 33/18 |
| 10,437,472 B2 * | 10/2019 | Bhuiyan | G11C 29/028 |
| 10,840,896 B2 * | 11/2020 | Chae | G01R 31/31721 |
| 2007/0075753 A1 * | 4/2007 | Parker | G01R 29/02 327/116 |

* cited by examiner

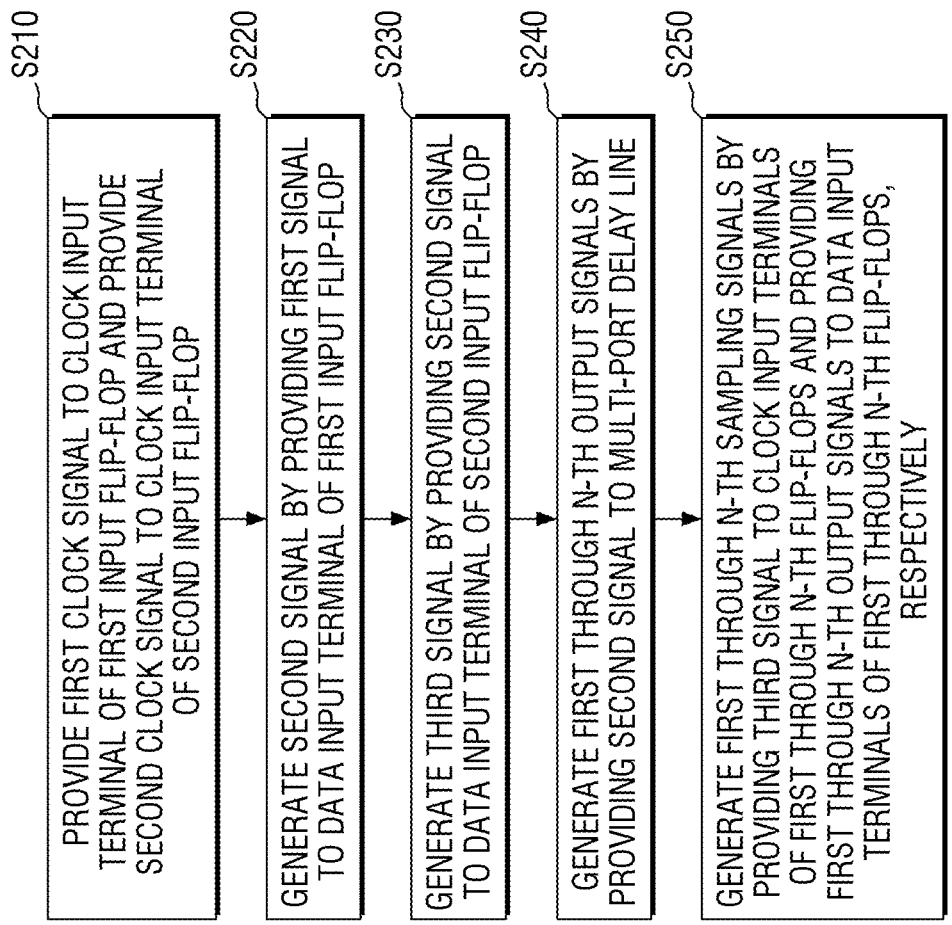

| OUT[4:0] | DELAY |
|---|---|
| OUT[4] | $\Delta S - 2\Delta T$ |
| OUT[3] | $\Delta S - \Delta T$ |
| OUT[2] | $\Delta S$ |
| OUT[1] | $\Delta S + \Delta T$ |
| OUT[0] | $\Delta S + 2\Delta T$ |

| OUT[4:0] | DELAY |
|---|---|
| OUT[4] | $\Delta S$ |
| OUT[3] | $\Delta S + \Delta T$ |
| OUT[2] | $\Delta S + 2\Delta T$ |
| OUT[1] | $\Delta S + 3\Delta T$ |
| OUT[0] | $\Delta S + 4\Delta T$ |

| OUT[2:0] | PD[5:0] | DELAY |
|---|---|---|
| OUT[2] | PD[2] | $\Delta S$ |
| | PD[5] | $\Delta S + \Delta t$ |
| OUT[1] | PD[1] | $\Delta S + \Delta T$ |
| | PD[4] | $\Delta S + \Delta t + \Delta T$ |
| OUT[0] | PD[0] | $\Delta S + 2\Delta T$ |
| | PD[3] | $\Delta S + \Delta t + 2\Delta T$ |

DIGITAL MEASUREMENT CIRCUIT AND MEMORY SYSTEM USING THE SAME

This application is a continuation of U.S. non-provisional application Ser. No. 16/036,030, filed on Jul. 16, 2018, which claims the benefit of priority under 35 U.S.C. § 119 to Korean Patent Application No. 10-2017-0176956, filed on Dec. 21, 2017, in the Korean Intellectual Property Office, the disclosure of which is incorporated herein in its entirety by reference.

BACKGROUND

1. Field

Various example embodiments of the inventive concepts relate to a digital measurement circuit, digital measurement system, digital measurement method, and/or digital measurement non-transitory computer readable medium. More particularly, various example embodiments relate to a digital measurement circuit having high integration density and/or high measurement speed.

2. Description of the Related Art

Clock accuracy is very important in various digital systems fields. For example, in a double data rate (DDR) memory system, it is important to match a high pulse width and a low pulse width of a clock. To this end, the high pulse width and the low pulse width (hereinafter, referred to as a duty and/or duty cycle) of the clock must be measured first.

The duty of the clock can be measured by charging/discharging a capacitor using a charge pump. Specifically, each capacitor is charged using a clock signal and an inverted clock signal. Each capacitor is repeatedly charged and discharged. That is, a capacitor is charged when its voltage is at a high level and is discharged when the its voltage is at a low level. When the clock signal is at a high level, a capacitor connected to the clock signal may be charged. On the other hand, when the clock signal is at a high level, a capacitor connected to the inverted clock signal may be discharged. Therefore, the charging and discharging of each capacitor may be opposite to each other. Here, whether the high pulse width of the clock is 50% or more may be determined at a point where the respective voltages of the capacitors are matched by a comparator.

However, since each capacitor is repeatedly charged and discharged, ripples occur. To reduce, limit, and/or minimize the ripples, the current of the charge pump should be reduced, or the capacitance value of each capacitor should be increased. In this case, however, it may take more time for the voltages of the capacitors to converge. In addition, the increase in the capacitance value of each capacitor may eventually widen the area, thus reducing integration density.

Consequently, the conventional method of measuring the duty requires a lot of time and reduces integration density.

SUMMARY

Aspects of at least one example embodiment of the inventive concepts provide a digital measurement circuit which measures a duty at high speed.

Aspects of at least one example embodiment of the inventive concepts also provide a digital measurement circuit which can be implemented as a digital device having a small area.

Aspects of at least one example embodiment of the inventive concepts also provide a digital measurement circuit which can measure the noise of a power supply voltage.

However, aspects of the example embodiments of the inventive concepts are not restricted to the one set forth herein. The above and other aspects of the example embodiments of the inventive concepts will become more apparent to one of ordinary skill in the art to which the inventive concepts pertain by referencing the detailed description of the example embodiments of the inventive concepts given below.

According to an aspect of at least one example embodiment of the inventive concepts, there is provided a digital measurement circuit comprising: a first input flip-flop configured to receive a first signal through a data input terminal, receive a first clock signal through a clock input terminal, and output a second signal, a second input flip-flop configured to receive the second signal through a data input terminal, receive a second clock signal through a clock input terminal, the second clock signal being an inverted signal of the first clock signal, and output a third signal, a delay line configured to receive the second signal, and output first through n-th output signals, wherein n is an integer greater than one, and first through n-th sampling flip-flops configured to receive the first through n-th output signals based on the third signal, and output first through n-th sampling signals.

According to another aspect of at least one example embodiment of the inventive concepts, there is provided a digital measurement circuit comprising: a first input flip-flop configured to receive a first signal and a first clock signal, and output a second signal, a second input flip-flop configured to receive the second signal and a second clock signal, and output a third signal, the second clock signal being an inverted signal of the first clock signal, and a delay line configured to receive and delay the second signal, and output the delayed second signal as first through n-th output signals, wherein the second signal is enabled at a rising time of the first clock signal, and the third signal is enabled at a falling time of the first clock signal.

According to another aspect of at least one example embodiment of the inventive concepts, there is provided a memory system comprising: a clock generator configured to provide an internal clock signal, a memory cell array configured to store data, an input/output driver configured to receive the internal clock signal from the clock provider, and input or output the data stored in the memory cell array based on the internal clock signal, and the clock generator comprises a duty measuring circuit configured to generate a first signal at a rising time of the internal clock signal, delay the first signal by $\Delta T$ through $n*(\Delta T)$, output each the delayed first signals which are delayed by $\Delta T$ through $n*(\Delta T)$ respectively, and measure a high pulse width of the internal clock signal using the delayed first signals.

BRIEF DESCRIPTION OF THE DRAWINGS

These and/or other aspects will become apparent and more readily appreciated from the following description of the example embodiments, taken in conjunction with the accompanying drawings in which:

FIG. 2 is a flowchart illustrating the operation of the digital measurement circuit for measuring the duty of the external clock signal according to at least one example embodiment.

FIGS. 3A and 3B illustrate delay times of the first through $n^{th}$ output signals according to at least one example embodiment.

FIG. 10 illustrates the relationship between an output signal, a sampling signal, and a delay time according to at least one example embodiment.

DETAILED DESCRIPTION

Figure 1:
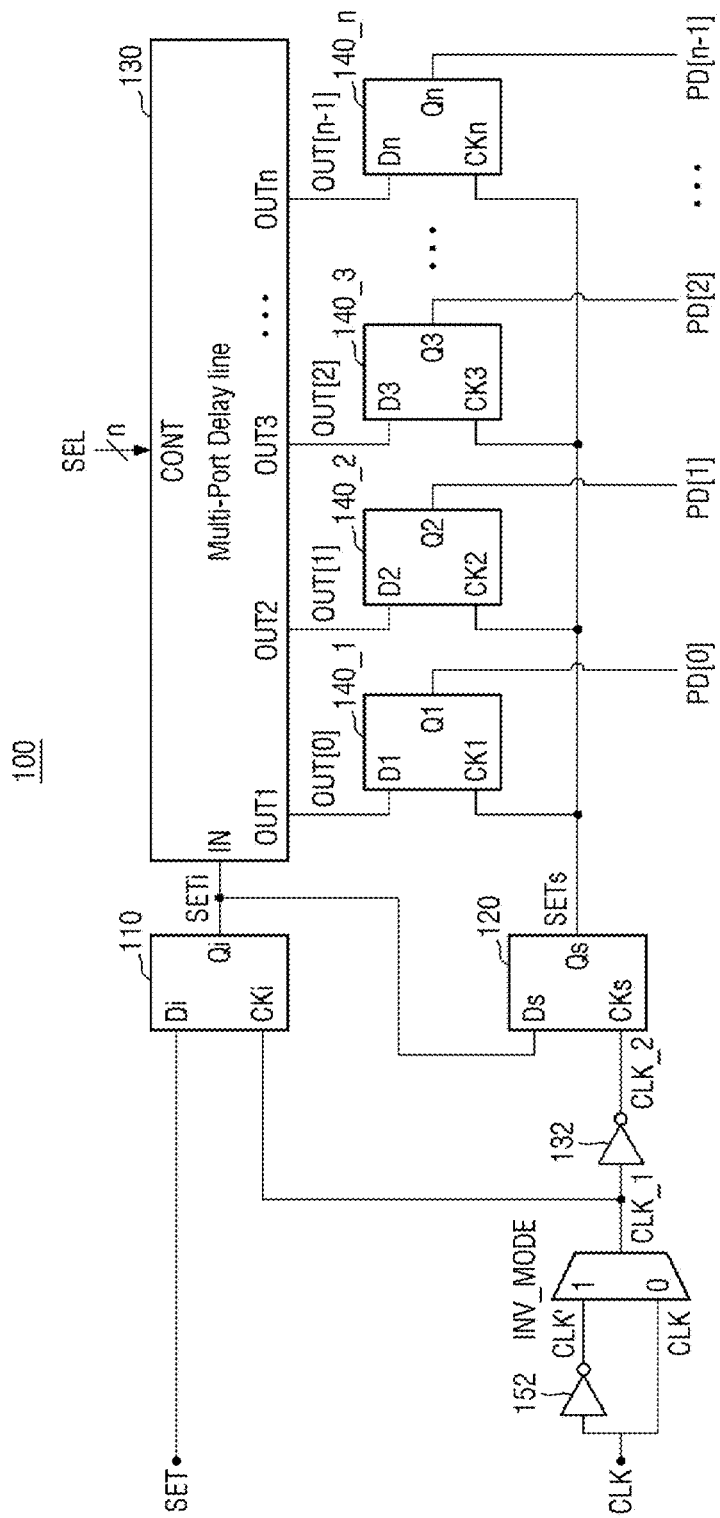
FIG. 1 illustrates a digital measurement circuit according to at least one example embodiment.

FIG. 1 illustrates a digital measurement circuit 100 according to at least one example embodiment.

Referring to FIG. 1, the digital measurement circuit 100 according to at least one example embodiment may include a plurality of flip-flops, such as a first input flip-flop 110, and a second input flip-flop 120, etc., a multi-port delay line 130, a plurality of flip flops, such as a first through $n^{th}$ flip-flops 140_1 through 140_n, and/or a multiplexer 150, but the example embodiments are not limited thereto.

The first input flip-flop 110 may include a data input terminal Di, a clock input terminal CKi, and an output terminal Qi, etc. The second input flip-flop 120 may include a data input terminal Ds, a clock input terminal CKs, and an output terminal Qs, etc. The multi-port delay line 130 may include an input terminal IN, a control terminal CONT, and first through nm output terminals OUT1 through OUTn, etc. The first through $n^{th}$ flip-flops 140_1 through 140_n (e.g., sampling flip-flops, etc.) may include data input terminals D1 through Dn, clock input terminals CK1 through CKn, and output terminals Q1 through Qn, respectively. The multiplexer 150 may include first and second input terminals 0 and 1 and one output terminal, but is not limited thereto.

The data input terminal Di of the first input flip-flop 110 may be connected to the outside (e.g., an external source). That is, a first signal SET may be provided from the outside (e.g., outside of and/or external to the digital measurement circuit 100) to the data input terminal Di of the first input flip-flop 110. The clock input terminal CKi of the first input flip-flop 110 may be connected to the output terminal of the multiplexer 150. The output terminal Qi of the first input flip-flop 110 may be connected to the input terminal IN of the multi-port delay line 130. In addition, the output terminal Qi of the first input flip-flop 110 may be connected to the data input terminal Ds of the second input flip-flop 120.

The clock input terminal CKs of the second input flip-flop 120 may be connected to the output terminal of the multiplexer 150 through an inverter 132. In other words, the clock input terminal CKs of the second input flip-flop 120 may be connected to an output terminal of the inverter 132. The output terminal of the multiplexer 150 may be connected to an input terminal of the inverter 132. The output terminal Qs of the second input flip-flop 120 may be connected to the respective clock input terminals CK1 through CKn of the first through $n^{th}$ flip-flops 1401 through 140_n.

The control terminal CONT of the multi-port delay line 130 may be connected to the outside (e.g., an external source). That is, n control signals SEL may be provided from the outside (e.g., outside of and/or external to the digital measurement circuit 100) to the control terminal CONT of the multi-port delay line 130. The first through $n^{th}$ output terminals OUT1 through OUTn of the multi-port delay line 130 may be connected to the data input terminals D1 through Dn of the first through $n^{th}$ flip-flops 1401 through 140_n, respectively. For example, the first output terminal OUT1 may be connected to the data input terminal D1 of the first flip-flop 140_1. The multi-port delay line 130 may be, but is not limited to, a glitch-free NAND-based digital delay line, etc.

The output terminals Q1 through Qn of the first through $n^{th}$ flip-flops 1401 through 140_n may be connected to the outside (e.g., an external source). That is, the output terminals Q1 through Qn of the first through $n^{th}$ flip-flops 140_1 through 140_n may respectively provide first through $n^{th}$ sampling signals PD[0] through PD[n−1].

The input terminal 0 of the multiplexer 150 may be connected to the outside (e.g., an external source). That is, an external clock signal CLK may be provided to the input terminal 0 of the multiplexer 150. The other input terminal 1 of the multiplexer 150 may be connected to the outside through an inverter 152. In other words, the other input terminal 1 of the multiplexer 150 may be connected to an output terminal of the inverter 152. An input terminal of the inverter 152 may be connected to the outside (e.g., an external source). In other words, the external clock signal CLK may be provided to the input terminal 0 of the multiplexer 150. In addition, an inverted signal CLK' of the external clock signal CLK (e.g., an inverted CLK signal) may be provided to the other input terminal 1 of the multiplexer 150.

The multiplexer 150 may output the external clock signal CLK in a first mode, e.g., when INV_MODE=0, but the example embodiments are not limited thereto. On the other hand, the multiplexer 150 may output the inverted signal CLK' of the external clock signal CLK in a second mode, e.g., when INV_MODE=1. The operation of the digital measurement circuit 100 for measuring the duty of the external clock signal CLK will now be described with reference to FIG. 2.

FIG. 2 is a flowchart illustrating the operation of the digital measurement circuit 100 for measuring the duty of the external clock signal CLK according to some example embodiments.

According to at least one example embodiment, a first clock signal CLK_1 may be provided to the clock input terminal CKi of the first flip-flop 110, and a second clock signal CLK_2 may be provided to the clock input terminal CKs of the second flip-flop 120 (operation S210), but the example embodiments are not limited thereto.

The first clock signal CLK_1 may be a signal output from the multiplexer 150. That is, the first clock signal CLK_1 may be the external clock signal CLK, or the first clock signal CLK_1 may also be the inverted signal CLK' of the external clock signal CLK. Specifically, the multiplexer 150 may output the external clock signal CLK as the first clock signal CLK_1 in the first mode, e.g., INV_MODE=0. In addition, the multiplexer 150 may output the inverted signal CLK' of the external clock signal CLK as the first clock signal CLK_1 in the second mode, e.g., INV_MODE=1.

According to at least one example embodiment, the second clock signal CLK_2 may be an inverted signal of the first clock signal CLK_1, but the example embodiments are not limited thereto. For example, the inverter 132 may receive the first clock signal CLK_1 and output the second clock signal CLK_2.

In other words, when the first clock signal CLK_1 is the external clock signal CLK, the second clock signal CLK_2 may be the inverted signal CLK' of the external clock signal CLK. Likewise, when the first clock signal CLK_1 is the inverted signal CLK' of the external clock signal CLK, the second clock signal CLK_2 may be the external clock signal CLK.

In some example embodiments, it is assumed that there is no delay (e.g., a time delay) that occurs when a signal passes through the inverters 132 and 152.

The first signal SET received from the outside (e.g., an external source) may be provided to the data input terminal Di of the first input flip-flop 110. Here, the first input flip-flop 110 may output a second signal SETi based on the first clock signal CLK_1 (operation S220).

For example, the first input flip-flop 110 may be enabled by the first clock signal CLK_1. Therefore, the first input flip-flop 110 may output the second signal SETi at a rising time of the first clock signal CLK_1.

Hence, the second signal SETi may indicate (e.g., correspond to) the rising time of the first clock signal CLK_1. In other words, the time when the value of the second signal SETi is changed (e.g., from low to high or high to low) may be time that the first clock signal CLK_1 rises.

In some example embodiments, the second signal SETi may be the delayed first signal SET. In some example embodiments, the second signal SETi may be the first signal SET delayed from a rising time of the first signal SET to the rising time of the first clock signal CLK_1. In other words, the second signal SETi may be a delayed a desired period of time based on the rising time of the first signal SET.

The second signal SETi may be provided to the data input terminal Ds of the second input flip-flop 120. The second input flip-flop 120 may output a third signal SETs based on the second clock signal CLK_2 (operation S230).

For example, the second input flip-flop 120 may be enabled by the second clock signal CLK_2. Therefore, the second input flip-flop 120 may output the third signal SETs at a rising time of the second clock signal CLK_2.

The second clock signal CLK_2 may be the inverted signal of the first clock signal CLK_1. Therefore, the rising time of the second clock signal CLK_2 may be a falling time of the first clock signal CLK_1.

Hence, the third signal SETs may indicate the falling time of the first clock signal CLK_1. In other words, the time when the value of the third signal SETs is changed may be (e.g., may correspond to) the falling time of the first clock signal CLK_1.

In some example embodiments, the third signal SETs may be the delayed second signal SETi, but is not limited thereto. For example, in some example embodiments, the third signal SETs may be the second signal SETi delayed from the rising time of the second signal SETi to the falling time of the first clock signal CLK_1, etc. In some example embodiments, a difference between the second signal SETi and the third signal SETs may be a high pulse width of the first clock signal CLK_1.

The second signal SETi may be provided to the multi-port delay line 130. The multi-port delay line 130 may delay the second signal SETi to output a plurality of signals, for example, first through $n^{th}$ output signals OUT[0:n−1](operation S240). The relationship between the first through $n^{th}$ output signals OUT[0:n−1] will now be described with reference to FIGS. 3A and 3B.

FIGS. 3A and 3B illustrate delay times of the first through $n^{th}$ output signals OUT[0:n−1] according to some example embodiments. For ease of description, the delay times of the first through fifth output signals OUT[0:4] are illustrated in FIGS. 3A and 3B, but the example embodiments are not limited thereto and the number of output signals may be greater or lesser than five.

Referring to FIG. 3A, a table 300_1 shows the first through fifth output signals OUT[0:4], and delay times DELAY corresponding to the first through fifth output signals OUT[0:4]. The delay times DELAY (e.g., the desired delay periods) of the first through fifth output signals OUT[0:4] may be times by which the rising times of the first through fifth output signals OUT[0:4] have respectively been delayed from the rising time of the second signal SETi. For example, the first output signal OUT[0] may be a signal delayed by time $\{\Delta S+2(\Delta T)\}$ from the rising of the second signal SETi.

In some example embodiments, the third output signal OUT[2] may be a reference signal, but the example embodiments are not limited thereto. Based on the delay time $\Delta S$ of the third output signal OUT[2], the second output signal OUT[1] may be a signal that is more delayed than the third output signal OUT[2] by $\Delta T$. That is, the delay time (e.g., the desired delay time) of the second output signal OUT[1] may be $(\Delta S+\Delta T)$. The delay time (e.g., the desired delay time) of the first output signal OUT[0] may be $(\Delta S+2(\Delta T))$.

On the other hand, the fourth output signal OUT[3] may be a signal less delayed than the third output signal OUT[2] by $\Delta T$. That is, the delay time (e.g., the desired delay time) of the fourth output signal OUT[3] may be $\Delta S-\Delta T$. The delay time (e.g., the desired delay time) of the fifth output signal OUT[4] may be $\{\Delta S-2(\Delta T)\}$.

In some example embodiments, the delay times of adjacent output signals may be different from each other by $\Delta T$. For example, the difference between the delay times of the first output signal OUT[0] and the second output signal OUT[1] may be $\Delta T$, however the example embodiments are not limited thereto.

Referring to FIG. 3B, a table 300_2 shows the first through fifth output signals OUT[0:4], and the delay times DELAY corresponding to the first through fifth output signals OUT[0:4], however the example embodiments are not limited thereto. For ease of description, a description of elements and features identical or similar to those described above will be given briefly or omitted.

In some example embodiments, the fifth output signal OUT[4] may be the reference signal, but the example embodiments are not limited thereto. That is, the delay times (e.g., the desired delay times) of the first through fourth output signals OUT[0] through OUT[3] may respectively be {ΔS+4(ΔT)}, {ΔS+3(ΔT)}, {ΔS+2(ΔT)}, and (ΔS+ΔT) based on the delay time ΔS of the fifth output signal OUT[4], but the example embodiments are not limited thereto.

In some example embodiments, the delay time ΔS of the reference signal may be adjusted by (and/or using) the control signals SEL provided to the control terminal CONT of the multi-port delay line 130. For example, in FIG. 3A, the delay time ΔS of the third output signal OUT[2] may be increased or decreased by the control signals SEL.

In FIGS. 3A and 3B, the reference signal is the third output signal OUT[2] and the fifth output signal OUT[4], respectively. However, the example embodiments are not limited to this case, and the reference signal can be implemented in various ways by those skilled in the art. In addition, although a case where n=5 has been described in FIGS. 3A and 3B for ease of description, the example embodiments are not limited to this case.

Referring again to FIG. 2, the third signal SETs may be provided to the clock input terminals CK1 through CKn of the first through $n^{th}$ flip-flops 140_1 through 140_n. In addition, the first through $n^{th}$ output signals OUT[0:n−1] output from the multi-port delay line 130 may be input to the data input terminals D1 through Dn of the first through $n^{th}$ flip-flops 140_1 through 140_n, respectively. For example, the first output signal OUT[0] may be provided to the data input terminal D1 of the first flip-flop 140_1. The first through $n^{th}$ flip-flops 1401 through 140_n may respectively output the first through $n^{th}$ sampling signals PD[0:n−1] based on the third signal SETs (operation S250). For example, the first flip-flop 140_1 may output the first sampling signal PD[0] based on the third signal SETs.

Figure 4:
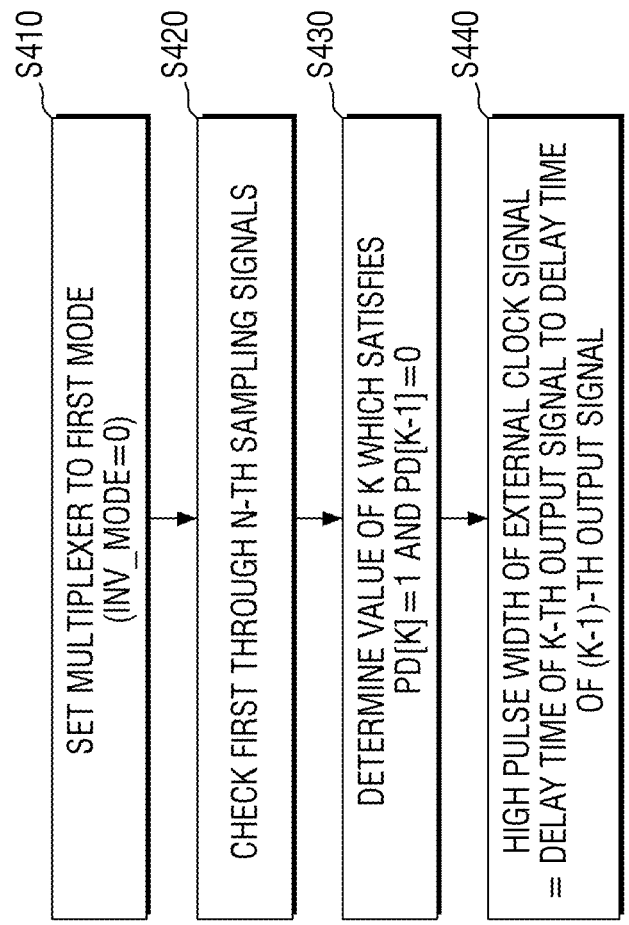
FIG. 4 is a flowchart illustrating a method of measuring a high pulse width of the external clock signal according to at least one example embodiment.

FIG. 4 is a flowchart illustrating a method of measuring a high pulse width of the external clock signal CLK according to some example embodiments.

Figure 5:
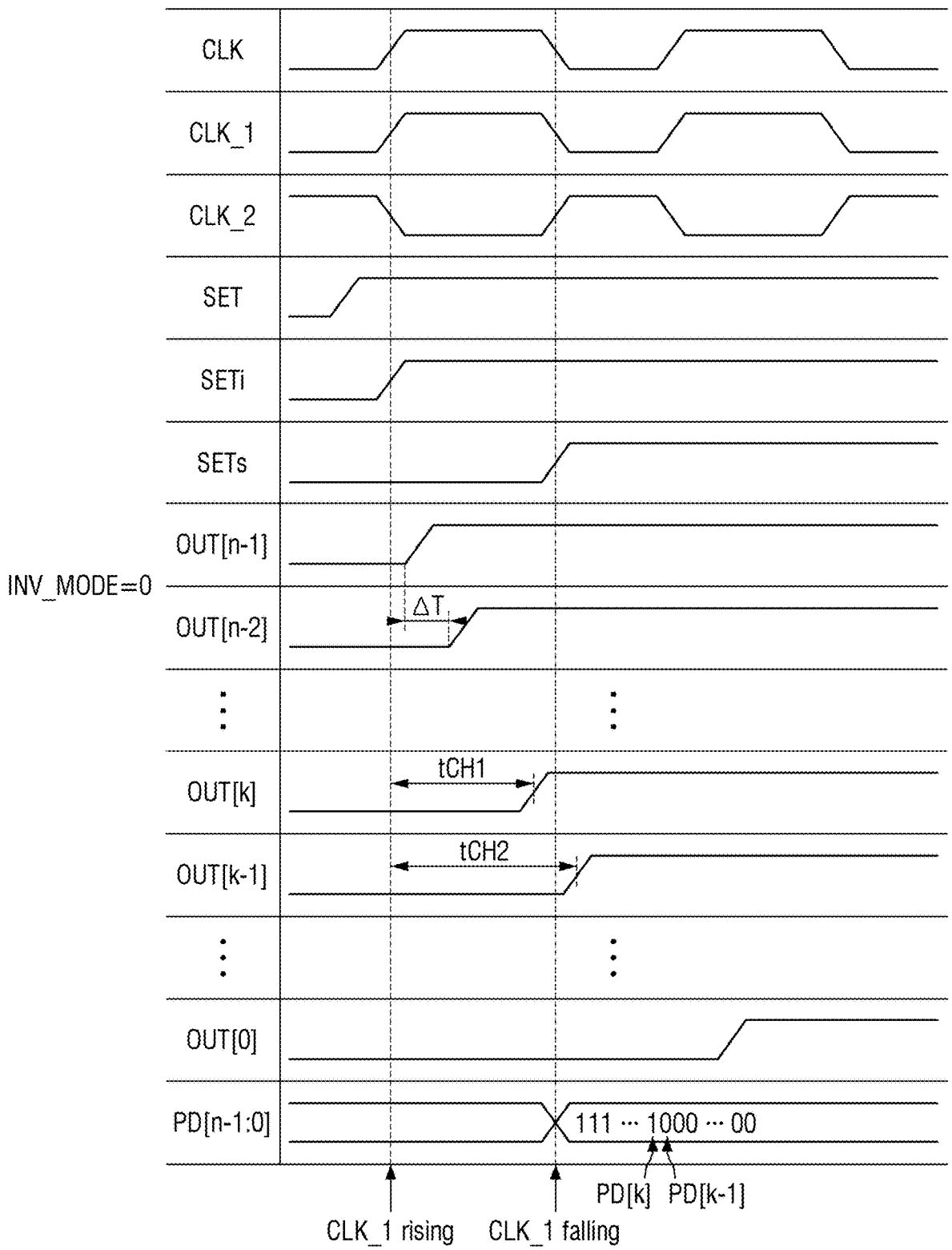
FIG. 5 is a timing diagram illustrating the method of measuring the high pulse width of the external clock signal according to at least one example embodiment.

FIG. 5 is a timing diagram illustrating the method of measuring the high pulse width of the external clock signal CLK according to at least one example embodiment.

Referring to FIGS. 1, 4 and 5, according to at least one example embodiment, the multiplexer 150 may be set to the first mode, e.g., when INV_MODE=(operation S410). The multiplexer 150 may output the external clock signal CLK as the first clock signal CLK_1 in the first mode INV_MODE=0. That is, the first clock signal CLK_1 may be the same as the external clock signal CLK in the first mode INV_MODE=0.

The first input flip-flop 110 may output the second signal SETi based on the first clock signal CLK_1. In some example embodiments, the second signal SETi may be output at a rising time of the first clock signal CLK_1 (e.g., when the value of the first clock signal CLK_1 transitions from zero to one).

The second input flip-flop 120 may output the third signal SETs based on the second clock signal CLK_2. In some example embodiments, the third signal SETs may be output at a rising time of the second clock signal CLK_2. In other words, the third signal SETs may be output at a falling time of the first clock signal CLK_1 (e.g., when the value of the first clock signal CLK_1 transitions from one to zero).

The multi-port delay line 130 may output the first through $n^{th}$ output signals OUT[0:n−1]. The multi-port delay line 130 may adjust the delay times (e.g., the desired delay times) of the first through $n^{th}$ output signals OUT[0:n−1] according to the control signals SEL. Each of the first through $n^{th}$ output signals OUT[0:n−1] may be the second signal SETi delayed to a different time.

The first through $n^{th}$ flip-flops 1401 through 140_n may output the first through $n^{th}$ sampling signals PD[0:n−1] based on the second clock signal CLK_2. In some example embodiments, the first through $n^{th}$ sampling signals PD[0:n−1] may be output at the rising time of the second clock signal CLK_2. In other words, the first through $n^{th}$ sampling signals PD[0:n−1] may be output at the falling time of the first clock signal CLK_1.

Therefore, the first through $n^{th}$ sampling signals PD[0:n−1] may be the values of the first through $n^{th}$ output signals OUT[0:n−1] at the falling time of the first clock signal CLK_1, respectively. For example, the first sampling signal PD[0] may be the value of the first output signal OUT[0] at the falling time of the first clock signal CLK_1.

When the first through n sampling signals PD[0:n−1] are output, the values of the first through $n^{th}$ sampling signals PD[0:n−1] are checked (operation S420). That is, for example, in each of the first through $n^{th}$ sampling signals PD[0:n−1], the value of k which satisfies PD[k]=1 and PD[k−1]=0 is determined (operation S430), but the example embodiments are not limited thereto. For example, the values of the first through $n^{th}$ sampling signals PD[0:n−1] may be checked by control logic (not shown) included in the digital measurement circuit itself, a duty measuring unit and/or a duty control unit (described in connection with FIGS. 14 and 15), an external processor, etc.

If PD[k]=1 and PD[k−]=0, it may mean that the third signal SETs rises while OUT[k] is delayed to OUT[k−1]. Referring to the timing diagram of FIG. 5, the value of OUT[k] may be 1 and the value of OUT[k−1] may be 0 at the falling time of the first clock signal CLK_1, that is, at the rising time of the third signal SETs. This may mean that the first clock signal CLK_1 falls while OUT[k] is delayed to OUT[k−1] by ΔT.

Each of the first through $n^{th}$ output signals OUT[0:n−1] may be the second signal SETi delayed to a different time from the rising time of the second signal SETi. In addition, the first through $n^{th}$ sampling signals PD[0:n−1] may be the values of the first through $n^{th}$ output signals OUT[0:n−1] at the falling time (e.g., CLK_1 falling) of the first clock signal CLK_1. Therefore, the time from the rising time (e.g., CLK_1 rising) of the first clock signal CLK_1 to the falling time (e.g., CLK_1 falling) of the first clock signal CLK_1 may be included in the range of a delay time tCH1 of OUT[k] to a delay time tCH2 of OUT[k−1]. Therefore, the high pulse width of the first clock signal CLK_1 may range from the delay time tCH1 of OUT[k] to the delay time tCH2 of OUT[k−1]. In some example embodiments, since the first clock signal CLK_1 is the same as the external clock signal CLK, the high pulse width of the external clock signal CLK may range from the delay time tCH1 of OUT[k] to the delay time tCH2 of OUT[k−1] (operation S440), but the example embodiments are not limited thereto.

For example, referring to the table 300_2 of FIG. 3B, if PD[2]=1 and PD[1]=0, the high pulse width of the first clock signal CLK_1, that is, the high pulse width of the external clock signal CLK may be greater than or equal to (ΔS+2ΔT), which is the delay time tCH1 of OUT[2], and smaller than or equal to (ΔS+3ΔT), which is the delay time tCH2 of OUT[1], but the example embodiments are not limited thereto.

Figure 6:
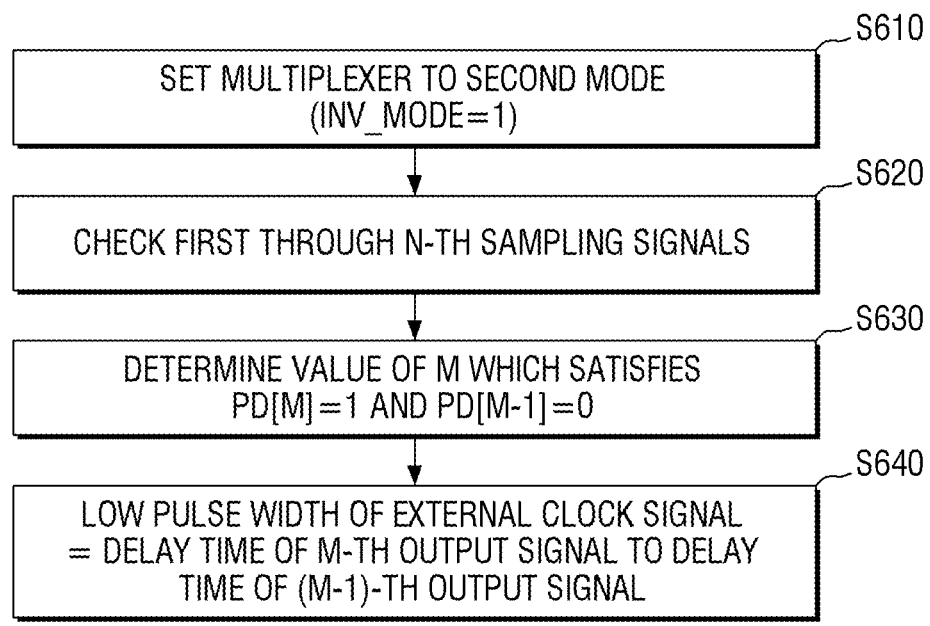
FIG. 6 is a flowchart illustrating a method of measuring a low pulse width of the external clock signal according to at least one example embodiment.

FIG. 6 is a flowchart illustrating a method of measuring a low pulse width of the external clock signal CLK according to at least one example embodiment.

Figure 7:
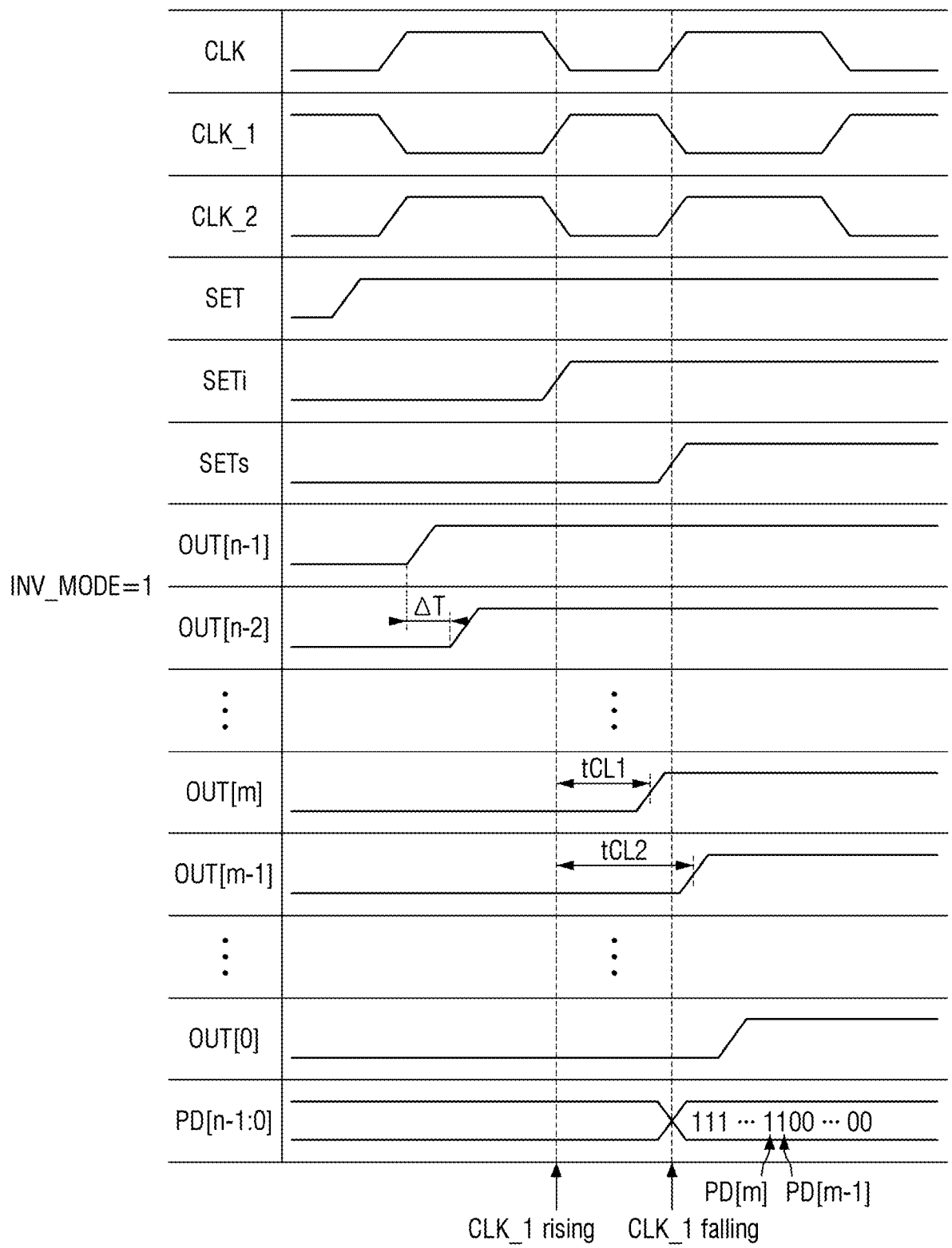
FIG. 7 is a timing diagram illustrating the method of measuring the low pulse width of the external clock signal according to at least one example embodiment.

FIG. 7 is a timing diagram illustrating the method of measuring the low pulse width of the external clock signal CLK according to at least one example embodiment. For ease of description, a description of elements and features identical or similar to those described above will be omitted or given briefly.

Referring to FIGS. 1, 6 and 7, according to at least one example embodiment, the multiplexer 150 may be set to the second mode. e.g., INV_MODE=1 (operation S610). The multiplexer 150 may output the inverted signal CLK' of the external clock signal CLK as the first clock signal CLK_1 in the second mode INV_MODE=1. That is, the first clock signal CLK_1 may be the same as the inverted signal CLK' of the external clock signal CLK.

The first through $n^{th}$ sampling signals PD[0:n–1] are checked to determine the value of m which satisfies PD[m]=1 and PD[m–1]=0 (operation S630). For example, the values of the first through $n^{th}$ sampling signals PD[0:n–1] may be checked by control logic (not shown) included in the digital measurement circuit itself, a duty measuring unit and/or a duty control unit (described in connection with FIGS. 14 and 15), an external processor, etc.

For example, the high pulse width of the first clock signal CLK_1 may be equal to a high pulse width of the inverted signal CLK' of the external clock signal CLK. In other words, the high pulse width of the first clock signal CLK_1 may be equal to the low pulse width of the external clock signal CLK. Therefore, the low pulse width of the external clock signal CLK may be a value between a delay time tCL1 of OUT[m] and a delay time tCL2 of OUT[m–1] (operation S640), but is not limited thereto.

For example, referring to the table 300_2 of FIG. 3B, if PD[4]=1 and PD[3]=0, the high pulse width of the first clock signal CLK_1, that is, the low pulse width of the external clock signal CLK, may be greater than or equal to ΔS, which is the delay time tCL1 of OUT[4], and smaller than or equal to (ΔS+ΔT), which is the delay time tCL2 of OUT [3].

According to at least one example embodiment, specific ranges of the high and low pulse widths of the external clock signal CLK may be provided, instead of the method providing whether the duty is greater than 50% as found in conventional duty measurement circuits. A digital measurement circuit (e.g., 100 of FIG. 1 or 800 of FIG. 8, etc.) according to at least one example embodiment of the inventive concepts can measure the duty of the external clock signal CLK at very high speed, particularly in comparison to conventional duty measurement circuits, using an all-digital circuit, and can be implemented in a small area and/or smaller area than conventional duty measurement circuits, which rely on analog capacitors that require much larger chip space on a semiconductor die than digital components.

In some example embodiments, a duty error tERR of the high pulse width and the low pulse width may be calculated. Therefore, when the digital measurement circuit (e.g., 100 of FIG. 1 or 800 of FIG. 8) according to at least one example embodiment is used, it is not necessary to repeatedly measure the duty of the external clock signal CLK to adjust the duty of the external clock signal CLK, as is required by conventional duty measurement circuits. That is, the duty error tERR according to some example embodiments may range from (tCH1–tCL2)/2 to (tCH2–tCL1)/2, but is not limited thereto.

For example, referring to the table 300_2 of FIG. 3B, if tCH1, tCH2, tCL1 and tCL2 are (ΔS+2ΔT), (ΔS+3ΔT), ΔS and (ΔS+ΔT), respectively, a measurement error according to some example embodiments may be {(ΔS+2ΔT)–(ΔS+ΔT)}/2 to {(ΔS+3ΔT)–(ΔS)}/2, that is, (ΔT)/2 to ΔT. Therefore, if the high pulse width of the external clock signal CLK is reduced by (ΔT)/2 to ΔT, the high pulse width and the low pulse width can be matched at 5:5.

In some example embodiments, if the value of ΔT is reduced, measurement accuracy can be further increased. That is, measurement resolution of the duty can be increased. Some example embodiments for increasing the measurement resolution will now be described with reference to FIGS. 8 and 9.

Figure 8:
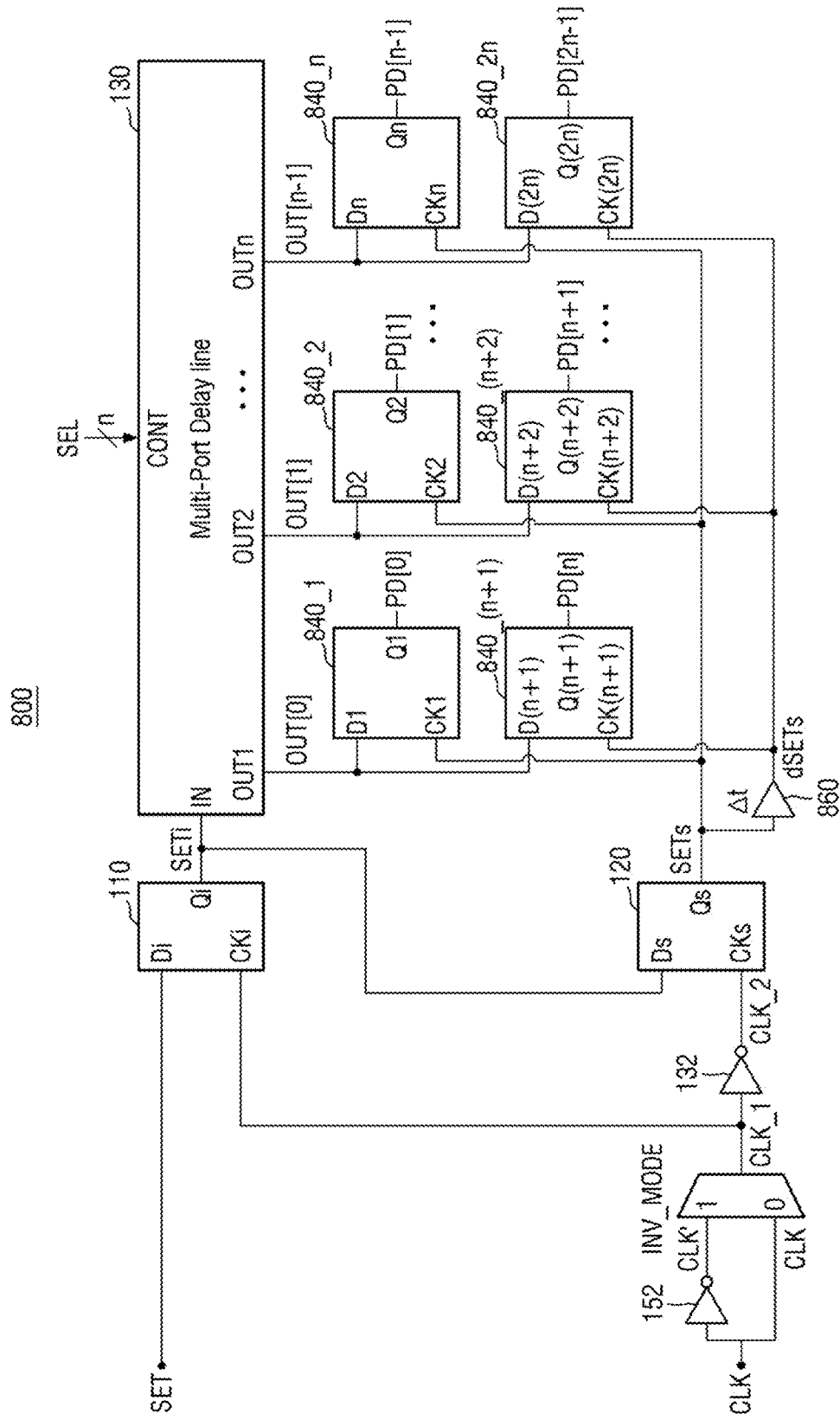
FIG. 8 illustrates a digital measurement circuit according to at least one example embodiment.

FIG. 8 illustrates a digital measurement circuit 800 according to some example embodiments.

Figure 9:
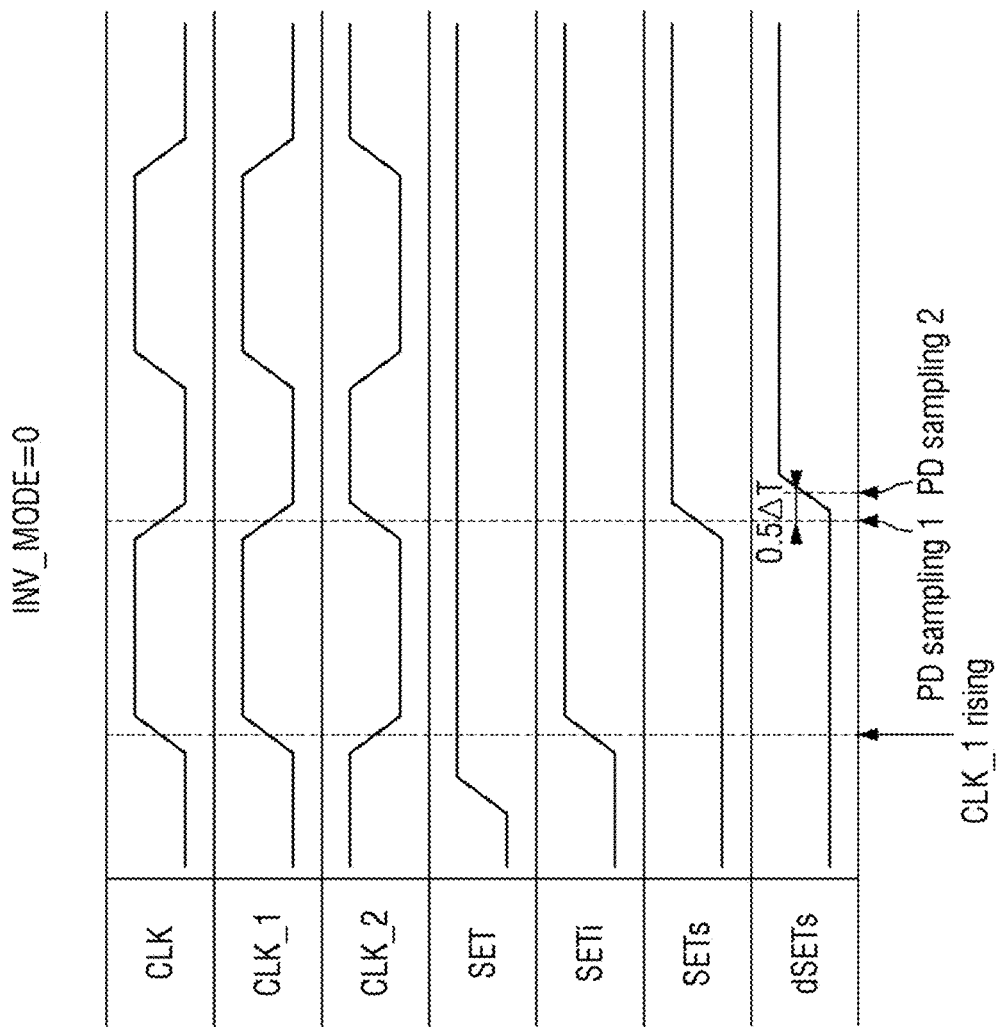
FIG. 9 is a timing diagram illustrating a method of measuring a high pulse width of an external clock signal according to at least one example embodiment.

FIG. 9 is a timing diagram illustrating a method of measuring a high pulse width of an external clock signal according to some example embodiments. For ease of description, description of elements and features identical or similar to those described above will be omitted or given briefly.

Referring to FIG. 8, the digital measurement circuit 800 according to at least one example embodiment may include a plurality of input flip-flops, such as a first input flip-flop 110 and a second input flip-flop 120, etc., a multi-port delay line 130, a plurality of second flip-flops, such as first through $(2n)^{th}$ flip-flops 840_1 through 840_2n, a multiplexer 150, and a delay cell 860, etc., but the example embodiments are not limited thereto.

The first through $(2n)^{th}$ flip-flops 840_1 through 840_2n may include data input terminals D1 through D(2n), clock input terminals CK1 through CK(2n), and output terminals Q1 through Q(2n), respectively.

An output terminal Qs of the second input flip-flop 120 may be connected to the respective clock input terminals CK1 through CKn of the first through $n^{th}$ flip-flops 840_1 through 840_n. In addition, the output terminal Qs of the second input flip-flop 120 may be connected to an input terminal of the delay cell 860.

An output terminal of the delay cell 860 may be connected to the respective clock input terminals CK(n+1) through CK(2n) of the (n+1)$^{th}$ through $(2n)^{th}$ flip-flops 840_(n+1) through 840_(2n).

First through $n^{th}$ output terminals OUT1 through OUTn of the multi-port delay line 130 may be connected to the data input terminals D1 through Dn of the first through $n^{th}$ flip-flops 840_1 through 840_n, respectively. In addition, the first through $n^{th}$ output terminals OUT1 through OUTn of the multi-port delay line 130 may be connected to the data input terminals D(n+1) through D(2n) of the (n+1)$^{th}$ through $(2n)^{th}$ flip-flops 840_(n+1) through 840_(2n), respectively. For example, the first output terminal OUT1 may be connected to the data input terminal D1 of the first slip-flop 840_1. For example, the first output terminal OUT1 may be connected to the data input terminal D(n+1) of the (n+1)$^{th}$ flip-flop 840_(n+1).

The output terminals Q1 through Q(2n) of the first through $(2n)^{th}$ flip-flops 840_1 through 840_(2n) may be connected to the outside. That is, the output terminals Q1 through Q(2n) of the first through $(2n)^{th}$ flip-flops 840_1 through 840_(2n) may respectively provide first through $(2n)^{th}$ sampling signals PD[0] through PD[2n–1] to the outside (e.g., an external component, etc.).

The delay cell 860 may delay a third signal SETs by ΔT and output the delayed third signal SETs as a fourth signal dSETs. In some example embodiments, Δt may be 0.5(ΔT).

Referring to FIGS. 8 and 9, the fourth signal dSETs may be a signal delayed by Δt from the third signal SETs. In some example embodiments, the first through $n^{th}$ flip-flops 840_1 through 840_n may output the first through the $n^{th}$ sampling signals PD[0:n–1] based on the third signal SETs. In other words, the first through the $n^{th}$ flip-flops 840_1 through 840_n may output the values of first through $n^{th}$ output signals OUT[0:n–1] at a first sampling time PD sampling 1 as the first through the $n^{th}$ sampling signals PD[0:n–1].

Additionally, the (n+1)$^{th}$ through $(2n)^{th}$ flip-flops 840_(n+1) through 840(2n) may output the (n+1)$^{th}$ through $(2n)^{th}$ sampling signals PD[n:2n−1] based on the fourth signal dSETs. In other words, the $(n+1)^{th}$ through $(2n)^{th}$ flip-flops 840_(n+1) through 840(2n) may output the values of $(n+1)^{th}$ through $(2n)^{th}$ output signals OUT[n:2n−1] at a second sampling time PD sampling2 as the $(n+1)^{th}$ through $(2n)^{th}$ sampling signals PD[n:2n−1]. For ease of description, this will be described using an example with reference to FIG. 10.

FIG. 10 illustrates the relationship between an output signal, a sampling signal, and a delay time according to at least one example embodiment.

With reference to FIGS. 8 through 10, a case where n=3 in the digital measurement circuit 800 according to at least one example embodiment will be described as an example. Delay times DELAY corresponding to the first through third sampling signals PD[0:2] may be (ΔS+2ΔT), (ΔS+ΔT), and ΔS, respectively, but the example embodiments are not limited thereto. Delay times DELAY corresponding to the fourth through sixth sampling signals PD[3:5] may be (ΔS+Δt+2ΔT), (ΔS+Δt+ΔT), and (ΔS+Δt), respectively, but the example embodiments are not limited thereto. For example, if PD 12:0=[110] and PD[5:3]=[100], it can be identified that '1' has changed to '0' in PD[1] and PD[4]. Therefore, a high pulse width of an external clock signal CLK according to at least one example embodiment may be included in the range of the delay time DELAY corresponding to PD[1] to the delay time DELAY corresponding to PD[4]. In other words, the high pulse width of the external clock signal CLK may range from (ΔS+ΔT) to (ΔS+Δt+ΔT). In some example embodiments, when Δt=0.5(ΔT), the high pulse width of the external clock signal CLK may be range from (ΔS+ΔT) to (ΔS+1.5(ΔT)). Therefore, when Δt=0.5 (ΔT), the measurement resolution of the digital measurement circuit 800 according to at least one example embodiment may be twice the measurement resolution of (e.g., twice as accurate as) the digital measurement circuit 100 of FIG. 1 described above.

Those of ordinary skill in the art will be able to implement a digital measurement circuit having at least twice higher resolution by using an appropriate method. For example, those skilled in the art will be able to implement a digital measurement circuit with high resolution by increasing the number of delay cells and flip-flops. In addition, those skilled in the art will be able to implement a digital measurement circuit with high resolution by repeatedly measuring the high pulse width a plurality of times while adjusting the value of Δt of the delay cell 860.

Although measuring the high pulse width of the external clock signal CLK according to at least one example embodiment has been described above, example embodiments are not limited to this case. That is, those of ordinary skill in the art will also be able to measure a low pulse width of the external clock signal CLK using the digital measurement circuit 800 of FIG. 8. Additionally, the example embodiments are not limited to the measurement of clock signals, and the example embodiments may be used to measure the pulse widths and/or duty cycles of any type of digital signal.

A method of measuring the magnitude of the noise of a power supply voltage using a digital measurement circuit according to some example embodiments will now be described with reference to FIGS. 1, 8, 11 through 13A and 13B.

Figure 11:
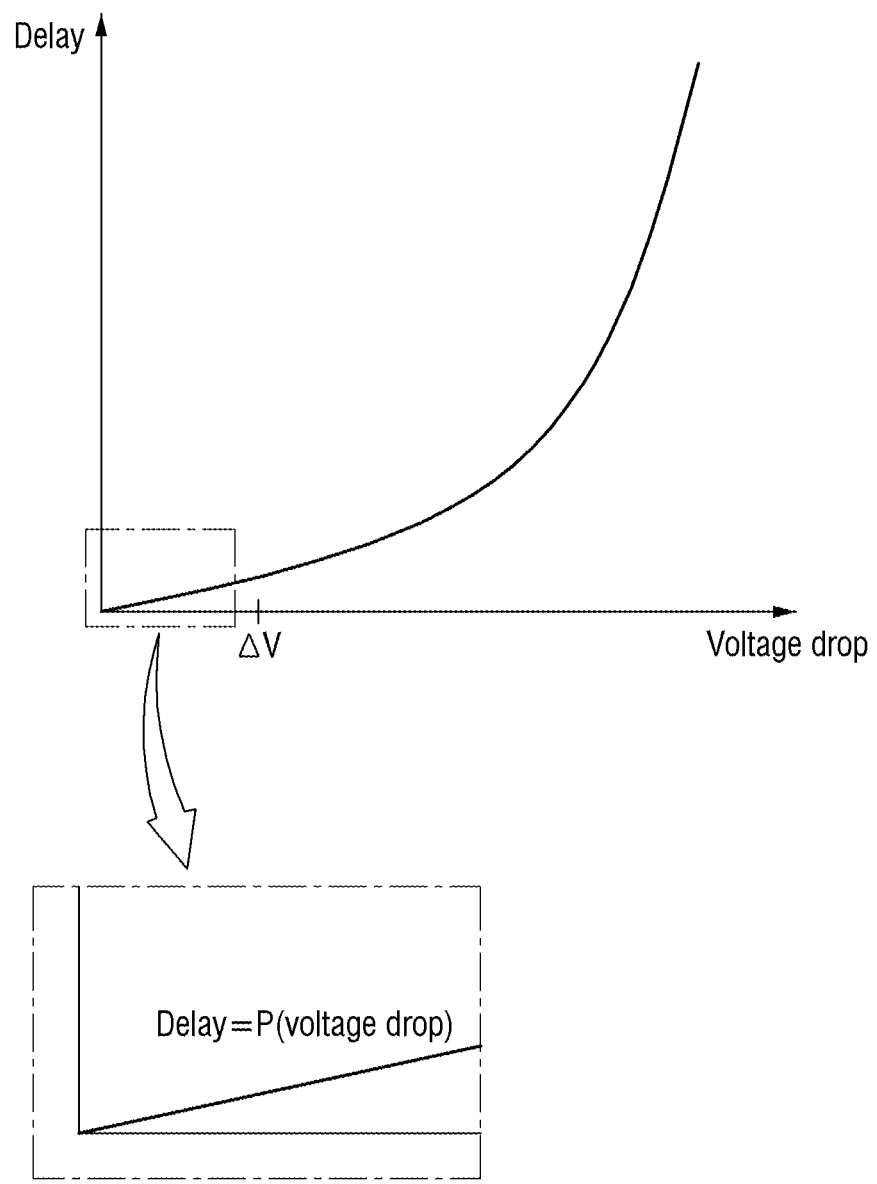
FIG. 11 is a graph illustrating the relationship between a drop in the power supply voltage and the delay time according to at least one example embodiment.
Figure 12:
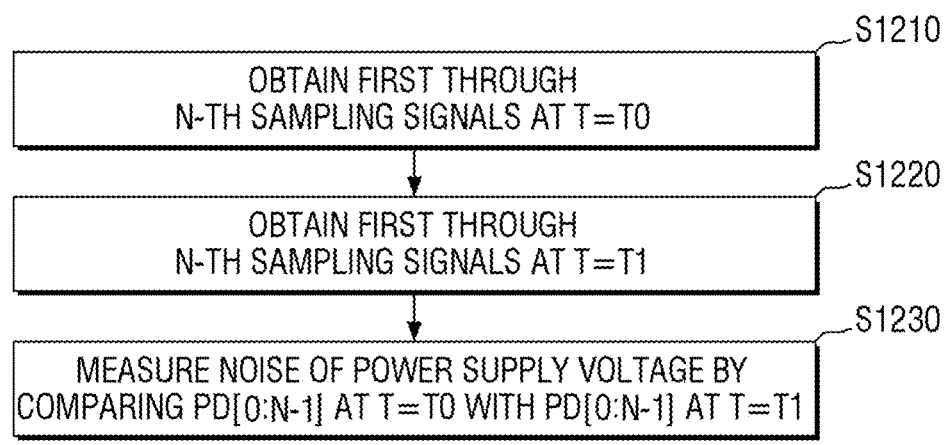
FIG. 12 is a flowchart illustrating a method of measuring the noise of the power supply voltage using a digital measurement circuit according to at least one example embodiment.
Figure 13A:
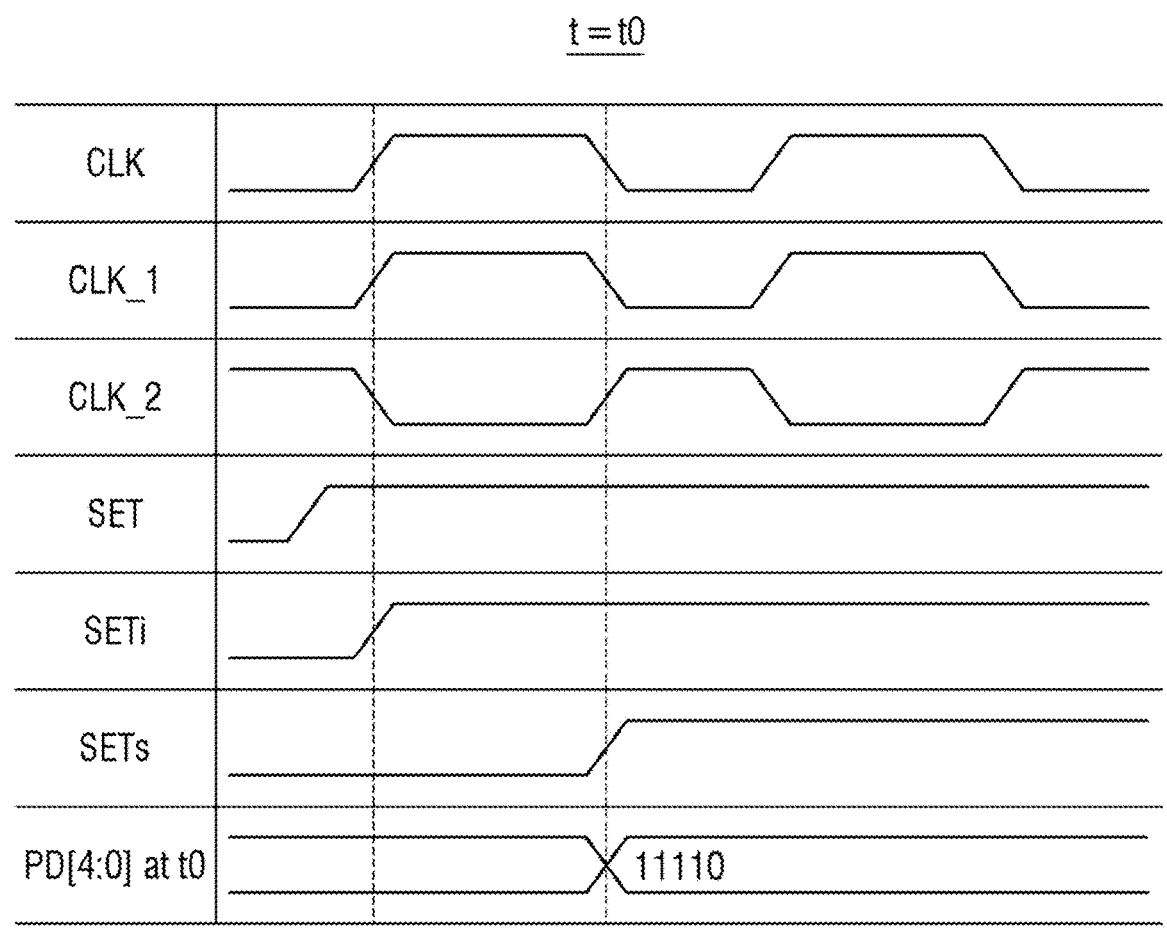
FIGS. 13A and 13B are timing diagrams illustrating the method of measuring the noise of the power supply voltage using the digital measurement circuit according to at least one example embodiment.
Figure 13B:
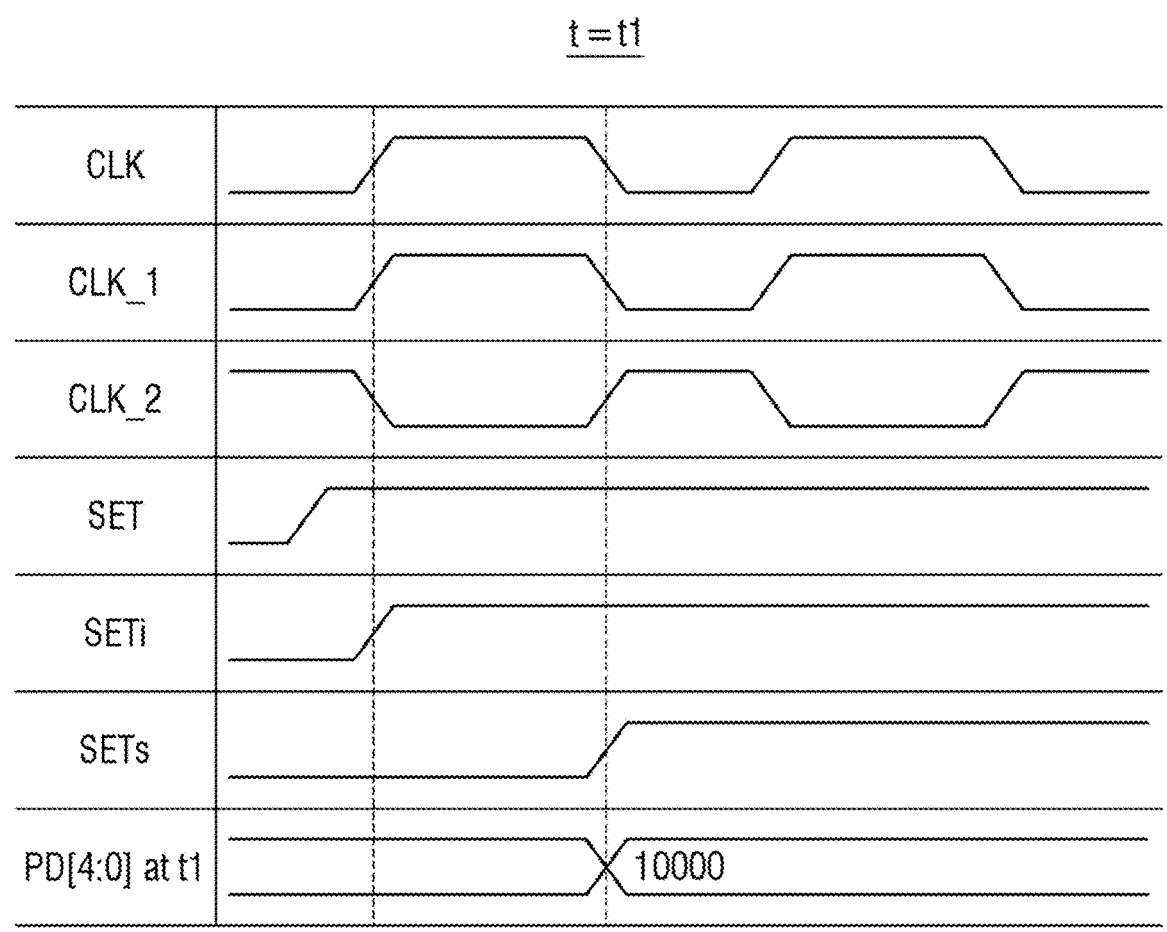

FIG. 11 is a graph illustrating the relationship between a drop in the power supply voltage and the delay time according to at least one example embodiment. FIG. 12 is a flowchart illustrating a method of measuring the noise of the power supply voltage using a digital measurement circuit according to at least one example embodiment. FIGS. 13A and 13B are timing diagrams illustrating the method of measuring the noise of the power supply voltage using the digital measurement circuit according to at least one example embodiment.

Referring to FIG. 11, as the drop in the power supply voltage increases, the delay time may increase exponentially. In other words, the longer the delay time, the lower the power supply voltage, and the shorter the delay time, the higher the power supply voltage. Based on this characteristic, it is possible to measure the amount of change in the power supply voltage, that is, the noise of the power supply voltage by using a digital measurement circuit (e.g., 100 of FIG. 1 or 800 of FIG. 8) according to at least one example embodiment. For ease of description, a method of measuring the noise of the power supply voltage using the digital measurement circuit 100 according to at least one example embodiment of FIG. 1 will be described below. However, example embodiments are not limited to this case. That is, the noise of the power supply voltage can also be measured using the digital measurement circuit 800 according to, for example, the at least one example embodiment of FIG. 8, etc.

First, at t=t0, first through $n^{th}$ sampling signal PD[0:n−1] may be generated using the digital measurement circuit 100 according to the at least one example embodiment of FIG. 1 (operation S1210).

Then, at t=t1, the first through $n^{th}$ sampling signals PD[0:n−1] may be generated using the digital measurement circuit 100 according to the at least one example embodiment of FIG. 1 (operation S1220).

In other words, at t=t0, the first through $n^{th}$ sampling signals PD[0:n−1] may be generated using the first signal SET, the second signal SETi, the third signal SETs, the multi-port delay line 130, and the first through $n^b$ flip-flops 1401 through 140_n.

Then, at t=t1, after at least one duty cycle, the first through $n^{th}$ sampling signals PD[0:n−1] may be generated in a state where all other conditions are kept the same. That is, the first through $n^{th}$ sampling signals PD[0:n−1] may be generated using the first signal SET, the second signal SETi, the third signal SETs, the multi-port delay line 130, and the first through $n^{th}$ flip-flops 1401 through 140_n.

The time difference between t0 and t1 may be at least one duty cycle, but is not limited thereto. One duty cycle may include one high pulse and one low pulse.

The degree of change (e.g., the amount of change) in the power supply voltage may be measured by comparing the first through $n^{th}$ sampling signals PD[0:n−1] at t0 generated at t=t0 and the first through $n^{th}$ sampling signals PD[0:n−1] at t1 generated at t=t1 (operation S1230). In other words, the amount of change in the power supply voltage may be measured based on the plurality of sampling signal results generated over time.

This will now be described with reference to FIGS. 13A and 13B. It is assumed that the first through fifth sampling signals PD[0] through pd[4] at t0 are generated at t=t0 and the first through fifth sampling signals PD[0] through pd[4] at t1 are generated at t=t1. For example, (PD[4:0] at t0)= [11110], and (PD[4:0] at t1)=10000. At t=t0, PD[1]=1, and PD[0]=0. However, at t=t1, PD[4]=1, and PD[3]=0.

When the first through fifth sampling signals PD[0] through pd[4] are output at t=t0 and t=t1, all other conditions may be kept the same. Therefore, the difference in the values of the first through fifth sampling signals PD[0] through pd[4] between t=t0 and t=t1 may be due to the noise of the power supply voltage. As time passes from t=t0 to t=t1, PD[1] may be delayed to PD[4] by 3 steps, and PD[0] may be delayed to PD[3] by 3 steps. In other words, as time passes from t=t0 to t=t1, the power supply voltage may drop by three steps.

Therefore, if the first through $n^{th}$ sampling signals PD[0:n−1] are generated at different times and compared, the relative degrees of change in the power supply voltage at the different times can be measured, and thus the amount of noise of the power supply voltage may be measured.

Referring to FIG. 11, the magnitude of the noise of the power supply voltage may be a relatively small value compared with the magnitude of the power supply voltage. For example, a noise generation range of the power supply voltage may be within ΔV. The drop in the power supply voltage and the delay time may have an exponential relationship. However, within the noise generation range ΔV, which is a relatively very small range, the relationship between the drop in the power supply voltage and the delay time can be approximated to a linear proportional relationship.

In other words, when the noise generation range ΔV is very small compared with the power supply voltage, the drop in the power supply voltage and the delay time may have a linear relationship of delay=P*(voltage drop). In this case, if the first through $n^{th}$ sampling signals PD[0:n−1] are generated at different times and compared, it is possible to approximately measure not only the relative degrees of change in the power supply voltage, but also the actual degrees of change in the power supply voltage.

Figure 14:
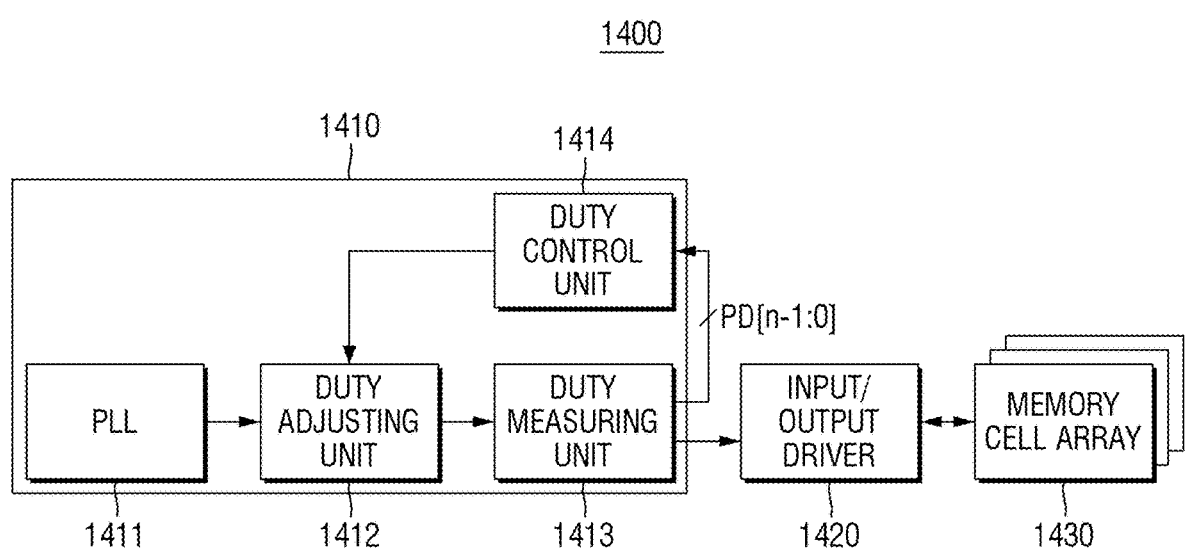
FIGS. 14 and 15 are block diagrams of memory systems 1400 and 1500 according to some embodiments.
Figure 15:
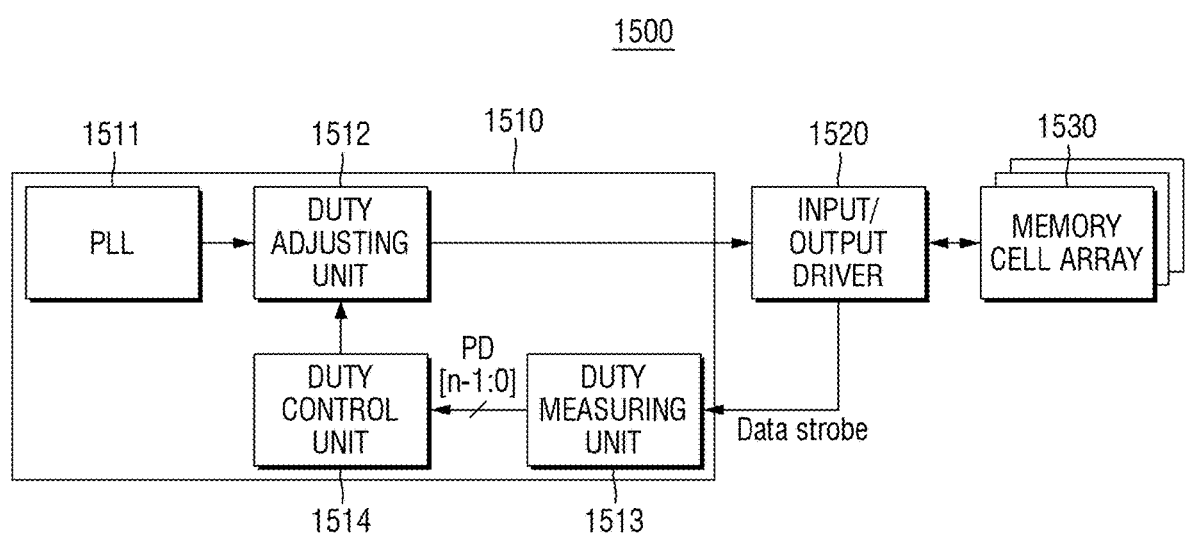

FIGS. 14 and 15 are block diagrams of memory systems 1400 and 1500 according to some example embodiments.

Referring to FIG. 14, the memory system 1400 according to at least one example embodiment may include a clock provider 1410 (e.g., a clock generator, a clock signal generator, etc.), an input/output driver 1420, and/or a memory cell array 1430, etc., but is not limited thereto. For example, while several components are illustrated in FIG. 14, the functionality of two or more components may be combined and performed by a single component and/or performed by a different component, etc.

The clock provider 1410 may include a phase-locked loop (PLL) 1411, a duty adjusting unit 1412, a duty measuring unit 1413 (e.g., a duty measuring circuit, etc.), and/or a duty control unit 1414 (e.g., duty controller, etc.), but is not limited thereto. For example, the functionality of the duty measuring unit 1413 and the duty control unit 1414 may be combined and performed by a single component, etc.

The PLL 1411 may receive a clock signal from the outside (e.g., an external source). The PLL 1411 may adjust the phase of the clock signal. The PLL 1411 may provide the phase-adjusted clock signal to the duty adjusting unit 1412.

The duty adjusting unit 1412 may increase, maintain, or decrease the duty of the phase-adjusted clock signal according to (and/or based on) a control signal received from the duty control unit 1414. The duty adjusting unit 1412 may provide the clock signal having the increased, maintained, or decreased duty to the duty measuring unit 1413.

The duty measuring unit 1413 may perform the same or similar function as a digital measurement circuit (e.g., 100 of FIG. 1 or 800 of FIG. 8) according to at least one example embodiment. For example, the duty measuring unit 1413 may receive the clock signal from the duty adjusting unit 1412. The duty measuring unit 1413 may generate first through $n^{th}$ sampling signals PD[0:n−1] using the received clock signal. The duty measuring unit 1413 may provide the first through $n^{th}$ sampling signals PD[0:n−1] to the duty control unit 1414. In addition, the duty measuring unit 1413 may provide the clock signal received from the duty adjusting unit 1412 to the input/output driver 1420.

The duty control unit 1414 may receive and check the first through $n^{th}$ sampling signals PD[0:n−1]. For example, the duty control unit 1414 may calculate a duty error tERR based on the first through $n^{th}$ sampling signals PD[0:n−1]. The duty control unit 1414 may generate a control signal based on the duty error tERR and provide the control signal to the duty adjusting unit 1412.

The input/output driver 1420 may receive the clock signal from the clock provider 1410. The input/output driver 1420 may read data stored in the memory cell array 1420 and/or write data to the memory cell array 1420 by using the clock signal.

Referring to FIG. 15, the memory system 1500 according to at least one example embodiment may include a clock provider 1510, an input/output driver 1520, and/or a memory cell array 1530, but the example embodiments are not limited thereto. For example, while several components are illustrated in FIG. 15, the functionality of two or more components may be combined and performed by a single component and/or performed by a different component, etc. For ease of description, a description of elements and features identical or similar to those described above will be omitted or given briefly.

The clock provider 1510 may include a PLL 1511, a duty adjusting unit 1512, a duty measuring unit 1513, and/or a duty control unit 1514, etc., but the example embodiments are not limited thereto.

The PLL 1511 may provide a phase-adjusted clock signal to the duty adjusting unit 1512. The duty adjusting unit 1512 may provide the clock signal having the increased, maintained, or decreased duty to the input/output driver 1520.

The input/output driver 1520 may receive the clock signal from the clock provider 1510. The input/output driver 1520 may read data stored in the memory cell array 1520 and/or write data to the memory cell array 1520 by using the clock signal. The input/output driver 1520 may receive a data strobe signal from the memory cell array 1520. The input/output driver 1520 may provide the data strobe signal to the duty measuring unit 1513.

The duty measuring unit 1513 may perform the same or similar function as a digital measurement circuit (e.g., 100 of FIG. 1 or 800 of FIG. 8) according to at least one example embodiment. The duty measuring unit 1513 may generate first through $n^{th}$ sampling signals PD[0:n−1] by using the received data strobe signal. The duty measuring unit 1513 may provide the first through n sampling signals PD[0:n−1] to the duty control unit 1514.

The duty control unit 1514 may receive and check the first through $n^{th}$ sampling signals PD[0:n−1]. For example, the duty control unit 1514 may calculate an duty error tERR of the data strobe signal based on the first through $n^{th}$ sampling signals PD[0:n−1]. The duty control unit 1514 may generate a control signal based on the duty error tERR and provide the control signal to the duty adjusting unit 1512.

Although some example embodiments of the inventive concepts have been disclosed for illustrative purposes, those skilled in the art will appreciate that various modifications, additions and substitutions are possible, without departing from the scope and spirit of the inventive concepts as disclosed in the accompanying claims.

What is claimed is:

1. A duty measurement circuit comprising:
    a first flip-flop configured to receive an enable signal and a clock signal, and to output a first output signal;

a second flip-flop configured to receive the first output signal and an inverted clock signal, and to output a second output signal;

an inverter including an input terminal directly connected to an input of the first flip-flop and configured to receive the clock signal, and an output terminal directly connected to an input of the second flip-flop and configured to output the inverted clock signal;

a delay line configured to delay the first output signal, and output a plurality of delayed signals by delaying the first output signal; and wherein at least one of a high or low pulse width of the clock signal is substantially equal to a difference between a rising time of the first output signal and a rising time of the second output signal.

2. The duty measurement circuit of claim 1, further comprising:

first through n-th sampling flip-flops configured to receive the plurality of delayed signals from the delay line, and output first through n-th sampling signals based on the second output signal.

3. The duty measurement circuit of claim 2, wherein the first through n-th sampling flip-flops are each configured to:

receive the respective plurality of delayed signals through data input terminals; and receive the second signal through respective clock input terminals.

4. The duty measurement circuit of claim 1, further comprising:

a multiplexer configured to output one of an external clock signal and an inverted external clock signal as the clock signal.

5. The duty measurement circuit of claim 4, wherein the multiplexer is further configured to:

output the external clock signal in a high pulse width measurement mode; and output the inverted external clock signal in a low pulse width measurement mode.

6. The duty measurement circuit of claim 1, wherein the first output signal is enabled at a rising time of the clock signal, and the second output signal is enabled at a falling time of the clock signal.

7. A method comprising:

receiving an enable signal and a clock signal;

generating a first signal by providing the enable signal and the clock signal to a first flip-flop;

inverting the clock signal to generate an inverted clock signal;

generating a second signal by providing the first signal and the inverted clock signal to a second flip-flop;

delaying the first signal to generate a plurality of delayed signals; and measuring a high pulse width of the clock signal based on the plurality of delayed signals;

wherein at least one of a high or low pulse width of the clock signal is substantially equal to a difference between a rising time of the first signal and a rising time of the second signal.

8. The method of claim 7, further comprising:
receiving the plurality of delayed signals; and
outputting first through n-th sampling signals based on the second signal.

9. The method of claim 8, further comprising:
receiving the plurality of delayed signals through data input terminals; and
receiving the second signal through clock input terminals.

10. The method of claim 8, further comprising:
calculating a duty error based on the first through n-th sampling signals.

11. The method of claim 7, further comprising:
outputting one of an external clock signal and an inverted external clock signal as the clock signal.

12. The method of claim 11, further comprising:
outputting the external clock signal in a high pulse width measurement mode; and
outputting the inverted external clock signal in a low pulse width measurement mode.

13. The method of claim 7, wherein
the first signal is enabled at a rising time of the clock signal; and
the second signal is enabled at a falling time of the clock signal.

14. A memory system comprising:
a memory cell array configured to store data;
an input/output driver configured to read the data stored in the memory cell array or write data to the memory cell array;
a phase-locked loop configured to receive a clock signal and adjust the clock signal;
duty adjusting circuitry configured to receive the adjusted clock signal from the phase-locked loop and adjust a duty of the adjusted clock signal based on a control signal;
duty measuring circuitry configured to,
receive an external signal according to at least one of the duty adjusted clock signal from the duty adjusting circuitry or a data strobe from the input/output driver,
generate a first internal signal and a second internal signal based on the external signal, and
delay the external signal to generate a plurality of delayed signals; and
duty control circuitry configured to receive the plurality of delayed signals, calculate a duty error of a pulse width of the duty adjusted clock signal or the data strobe based on the plurality of delayed signals, and generate the control signal based on the calculated duty error, wherein
the duty measuring circuitry includes,
a first flip-flop configured to receive the external signal, and to output the first internal signal,
a second flip-flop configured to receive the first internal signal, and to output the second internal signal, and
wherein at least one of a high or low pulse width of the clock signal is substantially equal to a difference between a rising time of the first internal signal and a rising time of the second internal signal.

15. The memory system of claim 14, wherein the duty measuring circuitry further comprises:
an inverter connected to an input of the second flip-flop, wherein the inverter being configured to generate an inverted clock signal based on the external signal; and
a delay line configured to delay the first internal signal, and output the plurality of delayed signals.

16. The memory system of claim 15, wherein the duty measuring circuitry further comprises:
first through n-th sampling flip-flops configured to receive the plurality of delayed signals based on the second internal signal, and output first through n-th sampling signals.

17. The memory system of claim 16, wherein the duty control circuitry is further configured to calculate the duty error based on the first through n-th sampling signals to generate the control signal.

18. The memory system of claim 14, wherein the duty measuring circuitry comprises a multiplexer configured to output one of the external signal and an inverted signal of the external signal.

19. The memory system of claim 14, wherein
the first internal signal is enabled at a rising time of the external signal, and
the second internal signal is enabled at a falling time of the external signal.

* * * * *